US007837352B2

(12) United States Patent
Graybill et al.

(10) Patent No.: US 7,837,352 B2
(45) Date of Patent: Nov. 23, 2010

(54) LIGHT SOURCE FOR ILLUMINATING AN ELECTRONICS RACK TO FACILITATE SERVICING THEREOF

(75) Inventors: David P. Graybill, Staasburg, NY (US); Madhusudan K. Iyengar, Woodstock, NY (US); Jeffrey A. Newcomer, Poughkeepsie, NY (US); Roger R. Schmidt, Poughkeepsie, NY (US); Prabjit Singh, Poughkeepsie, NY (US); Gerard V. Weber, Saugerties, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 11/954,272

(22) Filed: Dec. 12, 2007

(65) Prior Publication Data

US 2009/0154159 A1    Jun. 18, 2009

(51) Int. Cl.
*F21S 4/00* (2006.01)
(52) U.S. Cl. .............................. 362/249.02; 362/249.01
(58) Field of Classification Search ............ 362/249.02, 362/219, 240, 249.01
See application file for complete search history.

(56) References Cited

U.S. PATENT DOCUMENTS

| | | | | |
|---|---|---|---|---|
| 6,406,108 | B1 * | 6/2002 | Upton et al. ................. | 312/116 |
| 6,853,151 | B2 * | 2/2005 | Leong et al. ............. | 315/185 R |
| 7,049,761 | B2 * | 5/2006 | Timmermans et al. ...... | 315/246 |
| 7,312,980 | B2 * | 12/2007 | Ewing et al. ................. | 361/622 |
| 7,334,918 | B2 * | 2/2008 | Newton et al. .............. | 362/239 |
| 2002/0114155 | A1 * | 8/2002 | Katogi et al. ................ | 362/219 |
| 2007/0070615 | A1 * | 3/2007 | Joslin et al. ................... | 362/92 |
| 2008/0151496 | A1 * | 6/2008 | Lai et al. ..................... | 361/695 |
| 2008/0165526 | A1 * | 7/2008 | Saraiji et al. ................ | 362/125 |

OTHER PUBLICATIONS

"T-1¾ (5 mm) Extra Bright Precision Optical Performance White LED Lamps", Data Sheet, Avago Technologies (Apr. 2006).

* cited by examiner

*Primary Examiner*—Sandra L O'Shea
*Assistant Examiner*—Evan Dzierzynski
(74) *Attorney, Agent, or Firm*—Geraldine Monteleone; Kevin P. Radigan; Heslin Rothenberg Farley & Mesiti P.C.

(57) ABSTRACT

An apparatus is provided for facilitating servicing of an electronics rack. The apparatus includes a light source, which includes a plurality of light-emitting diodes. The plurality of light-emitting diodes are secured to the electronics rack or a floor tile disposed adjacent to the electronics rack, and are configured to illuminate at least a lower portion of the electronics rack at either the air inlet or air outlet side of the rack. A power supply is also provided for selectively supplying power to the plurality of light-emitting diodes. In one implementation, the light source includes an elongate light bar, which is configured to mount to either the inlet door or outlet door of the electronics rack, and the plurality of light-emitting diodes are secured to an elongate housing structure which pivotally couples to a base plate for adjustment of a direction of illumination by the light-emitting diodes.

8 Claims, 10 Drawing Sheets

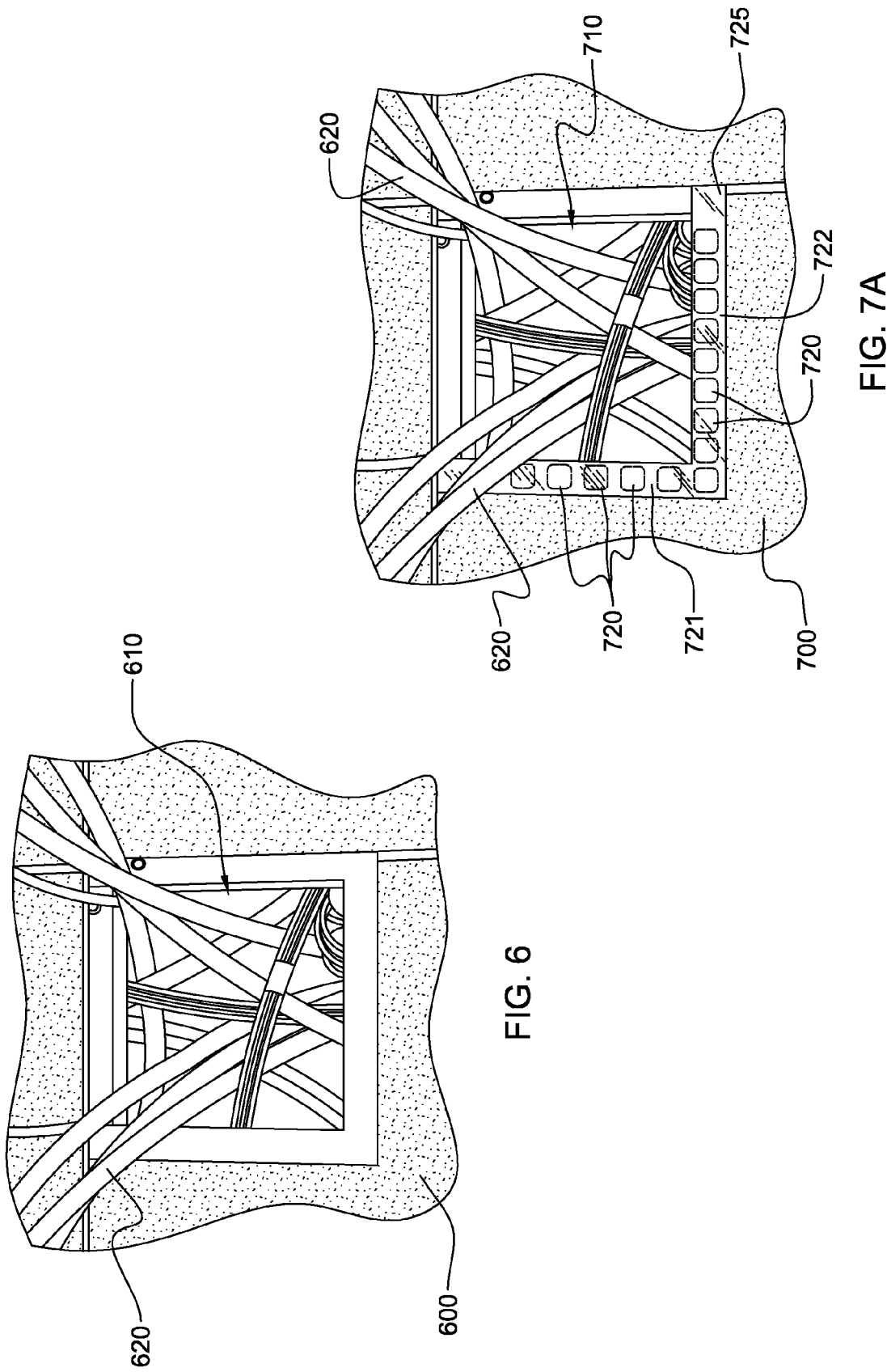

LIGHT SOURCE FOR ILLUMINATING AN ELECTRONICS RACK TO FACILITATE SERVICING THEREOF

TECHNICAL FIELD

The present invention relates in general to apparatuses for facilitating servicing of an electronics rack within a data center, and more particularly, to apparatuses for illuminating at least a lower portion of an electronics rack at one of an air inlet or air outlet side thereof.

BACKGROUND OF THE INVENTION

As is well known, as the circuit density of electronic chip devices increases in order to achieve faster and faster processing speeds, there is a corresponding demand for circuit devices to be packed more closely together, and for the circuits themselves to be operated at increasingly higher clock speeds. Each new generation of computers continues to offer increased speed and function. In most cases, this has been accomplished by a combination of increased power dissipation and increased packaging density. The net result has been increased circuit density at all levels of packaging, including at the electronics rack level. This increased packaging density has also resulted in increased cabling density at the electronics rack level.

SUMMARY OF THE INVENTION

Increased circuit density and cabling requirements at the rack level have resulted in less than ideal lighting conditions within the data center at the air inlet side and air outlet side of the electronics rack, and particularly, in the lower portion of the electronics rack. In a worst case, a less than ideal lighting condition may result in connector misplugs. Thus, a novel, low cost solution is provided herein for illuminating the air inlet side and/or air outlet side of an electronics rack.

In one aspect, the solution comprises an apparatus for facilitating servicing of an electronics rack. The apparatus includes a light source which comprises a plurality of light-emitting diodes and a power supply. The plurality of light-emitting diodes are sized and configured for mounting to one of the electronics rack or a floor tile disposed adjacent to the electronics rack. The diodes are configured to illuminate at least a lower portion of the electronics rack at one of an air inlet side or an air outlet side of the rack to facilitate servicing of at least the lower portion of the electronics rack. A power supply is also provided to supply power to the plurality of light-emitting diodes.

In another aspect, an electronics system is provided which includes an electronics rack and an apparatus for facilitating servicing of the electronics rack. The electronics rack includes: an air inlet side and an air outlet side, the air inlet and air outlet sides respectively enabling ingress and egress of external air; a rack frame; at least one electronics subsystem disposed within the electronics rack and supported by the rack frame; and at least one of an inlet door or an outlet door, each hingedly mounted along one edge to the rack frame of the electronics rack at one of the air inlet side or air outlet side thereof, respectively. The apparatus comprises a light source, wherein the light source comprises: a plurality of light-emitting diodes, the plurality of light-emitting diodes being secured to the electronics rack, and being configured to illuminate at least a lower portion of the electronics rack at one of the air inlet side or the air outlet side thereof to facilitate servicing of at least a lower portion of the electronics rack; and a power supply for supplying power to the plurality of light-emitting diodes.

In a further aspect, an electronics system is provided which includes an electronics rack and an apparatus for facilitating servicing of the electronics rack. The electronics rack includes: an air inlet side and an air outlet side, the air inlet and air outlet sides respectively enabling ingress and egress of external air; a rack frame; at least one electronics subsystem disposed within the electronics rack and supported by the rack frame; and at least one of an inlet door or an outlet door, each hingedly mounted along one edge to the rack frame of the electronics rack at one of the air inlet side or the air outlet side thereof, respectively. The apparatus comprises a light source, which includes: a plurality of light-emitting diodes, the plurality of light-emitting diodes being secured to a floor tile disposed adjacent to the electronics rack, and being configured to illuminate at least a lower portion of the electronics rack at one of the air inlet side or the air outlet side thereof to facilitate servicing of at least a lower portion of the electronics rack; and a power supply for supplying power to the plurality of light-emitting diodes.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6 illustrates a conventional floor tile with a corner cable cutout and showing cables passing therethrough;

FIG. 7A illustrates the floor tile with corner cable cutout of FIG. 6, with a light source shown disposed within the floor tile at multiple edges of the corner cable cutout, in accordance with an aspect of the present invention.

DETAILED DESCRIPTION OF THE INVENTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. An electronics rack comprises at least one electronics subsystem. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. In addition, "data center" refers to a computer installation to contain one or more electronics racks to be cooled. As a specific example, a data center may be designed to contain one or more rows of rack-mounted computing units, such as server units.

Reference is made below to the drawings, which are not drawn to scale for reasons of understanding, wherein the same reference numbers used throughout different figures designate the same or similar components.

Figure 1:
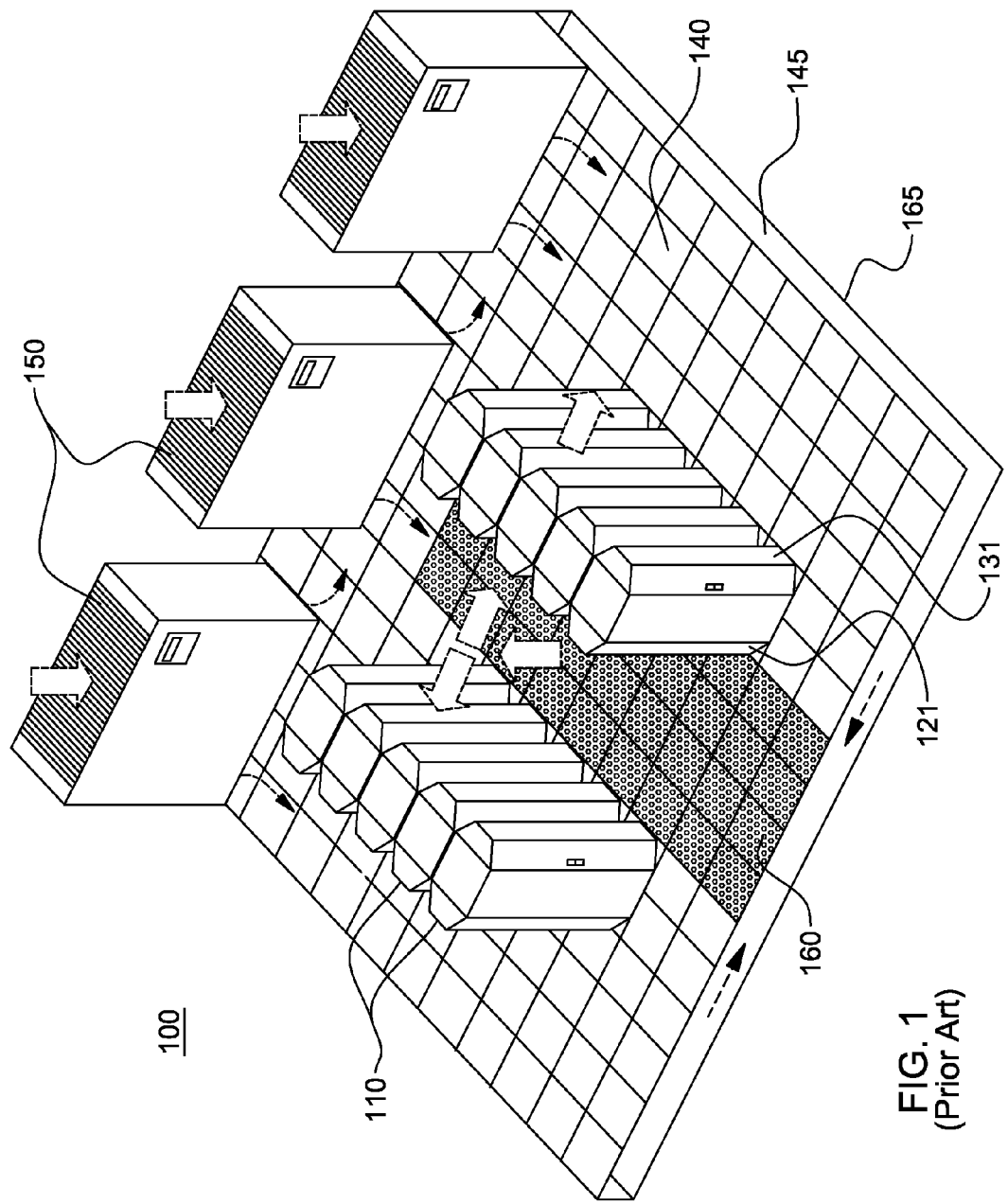
FIG. 1 depicts one embodiment of a conventional raised floor layout of an air-cooled data center.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered air inlet doors 121 of the electronics racks and expelled through louvered air outlet doors 131 of the electronics racks. Each electronics rack 110 may have an air moving device (e.g., fan or blower) to provide forced inlet-to-outlet air flow to cool the electronic components within the electronics subsystem(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more conditioned air units 150, also disposed within data center 100. Room air is taken into each conditioned air unit 150 near an upper portion thereof. This room air comprises in part exhausted air from the "hot" air aisles of the data center disposed adjacent to air outlet sides of the electronics racks 110.

As noted initially, in many data centers, the density of electronics subsystems within the electronics rack, and density of cabling required for those subsystems, has increased to the point that it has resulted in a lighting issue, particularly at the lower portion of the electronics rack at one or both of the air inlet and air outlet sides of the rack. Various light-emitting diode (LED) based light source configurations are disclosed below which address this issue, and thereby facilitate servicing of the electronics rack.

Figure 2:
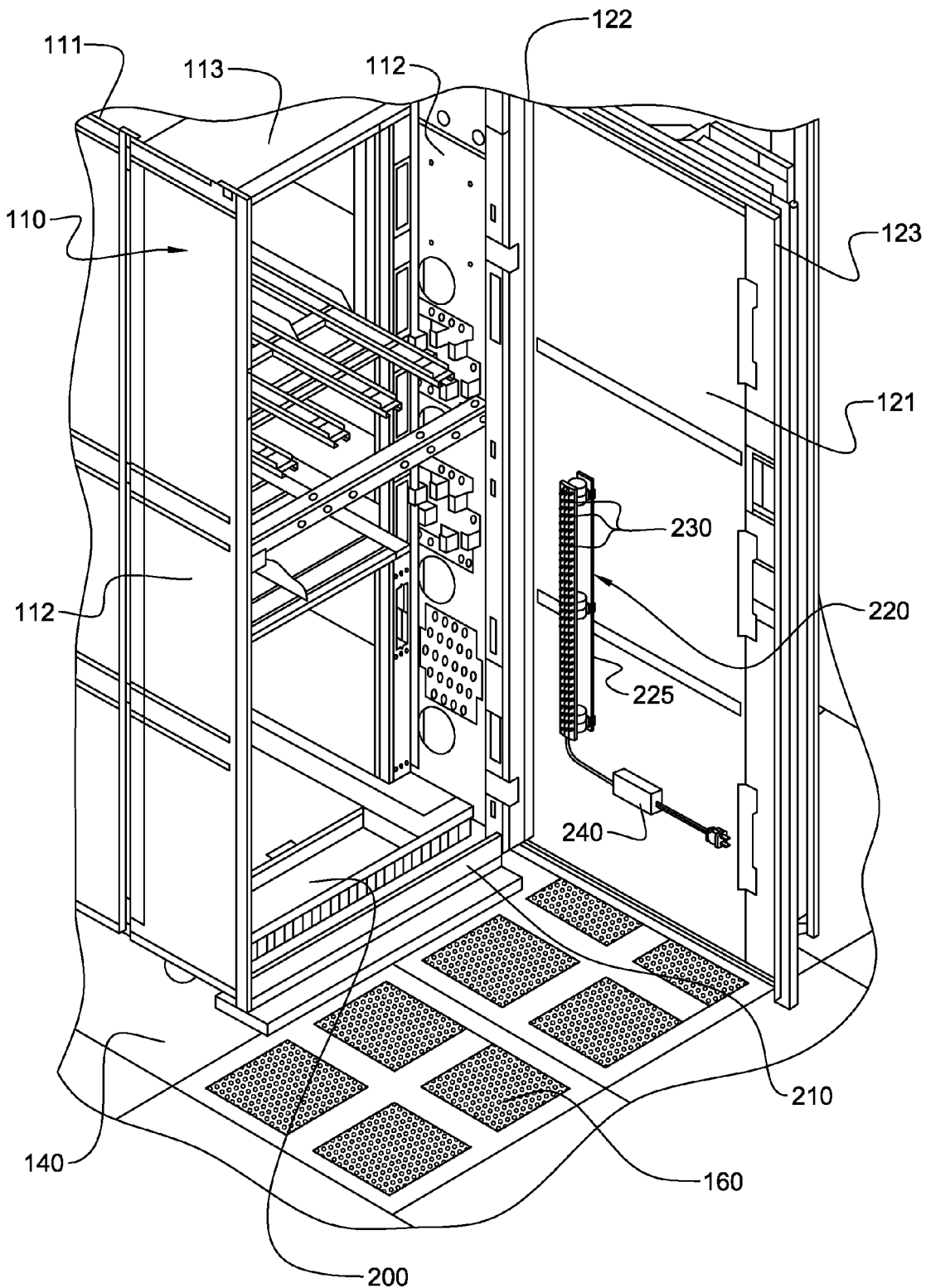
FIG. 2 is a partial perspective view of one embodiment of an electronics rack, with an inlet door thereof pivoted open and illustrating one embodiment of a light source, in accordance with an aspect of the present invention.

In accordance with an aspect of the present invention, FIG. 2 illustrates one embodiment of an electronics system comprising an electronics rack 110, wherein the electronics subsystems thereof are not shown, and an inlet door 121 thereof is pivoted open to expose the air inlet side of the electronics rack. Electronics rack 110 includes a rack frame 111 having opposing sides 112 and a top 113. Inlet door 121 includes a proximal edge 122 and a distal edge 123, and is hingedly mounted to rack frame 111 along proximal edge 122 thereof at the air inlet side of the electronics rack.

In the illustrated embodiment, electronics rack 110 resides on a raised floor 140 of a raised floor data center, and a plurality of perforated floor tiles 160 are shown disposed adjacent to the air inlet side of the electronics rack. Electronics rack 110 further includes an opening 200 for facilitating passage of cabling (see FIG. 5) to the under-floor plenum from the electronics subsystems (not shown) disposed within the rack. A front skirt 210 is provided to control airflow along the bottom of electronics rack 110. In this embodiment, cabling from the electronics rack passes behind front skirt 210 through opening 200.

As also illustrated, a light source, generally denoted 220, is provided in the electronics system of FIG. 2. Light source 220 is shown mounted to inlet door 121 in a lower portion thereof, closer to proximal edge 122 than distal edge 123. Light source 220 includes an elongate light bar 225, which is shown mounted vertically to inlet door 121 in a lower portion of the inlet door. Elongate light bar 225 includes a plurality of light-emitting diodes 230. A power supply 240 is also provided for providing an appropriate power level to the plurality of light-emitting diodes 230.

Advantageously, by mounting light source 220 as illustrated, the lower portion of the electronics rack is illuminated when the door is open to facilitate servicing of the electronics rack, including (for example) plugging of connectors into their respective receptacles.

In one embodiment, light-emitting diodes 230 form a light-emitting diode (LED) luminarie, which is configured to emit visible light, such as white light. By way of example, and as is well known, white LEDs can be fabricated from modified blue LEDs covered with a yellowish, phosphor coating to produce the appearance of white light. As a specific example, the light-emitting diodes might comprise T-1¾ (5 mm) extra bright, precision optical performance InGaN LED lamps, available from Avago Technologies, of San Jose, Calif. One advantage of employing such LED-based lighting is the lower power input required for the luminarie.

Figure 3:
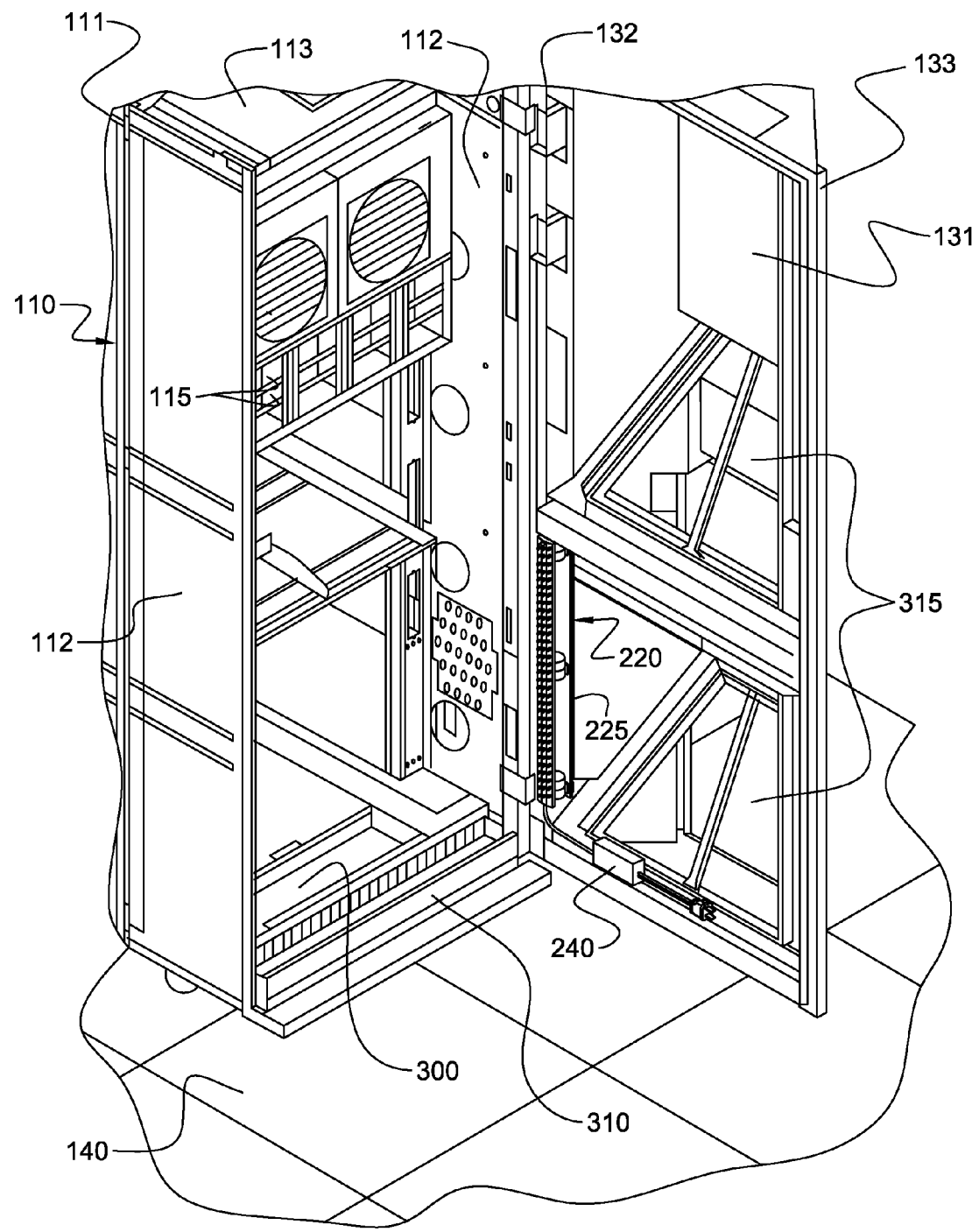
FIG. 3 is a partial perspective view of one embodiment of an electronics rack with an outlet door thereof pivoted open and illustrating the light source embodiment of FIG. 2 mounted thereto, in accordance with an aspect of the present invention.

FIG. 3 illustrates another embodiment of an electronics system comprising an electronics rack 110, with selected electronics subsystems 115 thereof shown, and with an outlet door 131 thereof pivoted open to expose the air outlet side of the electronics rack. Electronics rack 110 includes a rack frame 111 with opposing sides 112, and a top 113. Outlet door 131 includes a proximal edge 132 and a distal edge 133, and is hingedly mounted along proximal edge 132 to rack frame 111 at the air outlet side of the electronics rack. In the illustrated embodiment, outlet door 131 includes multiple airflow openings 315 for facilitating egress of air from the electronics rack, and thereby facilitating cooling of electronics subsystems 115 within electronics rack 110. An opening 300 is provided in the bottom of electronics rack 110 adjacent to the air outlet side thereof for facilitating passage of cabling, for example, from electronics subsystems 115 within the rack, to connection points under raised floor 140. A rear skirt 310 is provided to block airflow under electronics rack 110. This rear skirt 310 is disposed adjacent to cable opening 300 in the bottom of electronics rack 110.

Depending on the number of cables passing through opening 300, there may be less than ideal lighting in the lower portion of the electronics rack at the air outlet side thereof. Thus, light source 220 is provided. Light source 220 includes an elongate light bar 225 and a power supply 240 for supplying an appropriate voltage to a plurality of light-emitting diodes arrayed across elongate light bar 225, as described below. In the illustrated embodiment, elongate light bar 225 is configured to mount adjacent to proximal edge 132 of outlet door 131 to facilitate illumination of the lower portion of electronics rack 110 when outlet door 131 is pivoted open as shown. Elongate light bar 225 is disposed vertically in outlet door 131 to obtain a maximum vertical illumination of the lower portion of the electronics rack. In alternate embodiments, elongate light bar 225 could be disposed at an angle relative to the vertical or horizontal orientation of outlet door 131, and/or could be employed in the upper portion of outlet door 131 to illuminate an upper portion of the electronics rack. Still further, multiple elongate light bars 225 could be mounted to outlet door 131 for enhanced illumination of the air outlet side of the electronics rack.

FIGS. 4A-4D illustrate one embodiment of light source 220, in accordance with an aspect of the present invention. Referring collectively to these figures, light source 220 is shown to include elongate light bar 225, power supply 240 and a plug 400 for supplying power to power supply 240. In one embodiment, power supply 240 is a 16 volt, 4.5 amp power supply, such as a laptop power supply, and plug 400 is configured to plug into a conventional 110 volt outlet. The cord connecting plug 400 to power supply 240 may be of any desired length. Similarly, the electrical line connecting power supply 240 to elongate light bar 225 may be of any desired length depending on the mounting location for the elongate light bar and power supply.

In the illustrated embodiment, elongate light bar 225 includes a base plate 410 and an elongate, light-emitting diode housing structure 420. Base plate 410 is, in one embodiment, a flat plate having first and second main surfaces. A first main surface includes an attachment mechanism 415 coupled thereto for facilitating securement of the elongate light bar to the electronics rack at, for example, one of the inlet door or outlet door thereof.

In one embodiment, this attachment mechanism may be a temporary attachment mechanism, such as a portion of a hook and loop type fastener. As is known in the art, the hook side of a hook and loop type fastener comprises a piece of fabric covered with small plastic hooks, while the loop side is covered with an even smaller, higher density number of plastic loops. In use, an adhesive backing may be employed on one or more strips of material (not shown) secured to one of the inlet door or outlet door at the desired location, for example, adjacent to the proximal edge of the inlet door or outlet door. This adhesively secured material includes one of the hook side or loop side of the hook and loop type fastener, with the other of the hook side or loop side being secured to base plate 410 as attachment mechanism 415. By configuring and aligning the two sides of the readily separable fastener, elongate light bar 225 can be temporarily secured to one of the inlet door or outlet door at the desired location to facilitate servicing of the electronics rack.

Multiple hinges 425 (or indexed pivots) are employed in hingedly mounting elongate, light-emitting diode housing structure 420 to base plate 410. Hinged mounting of this housing structure to the base plate allows for directional adjustment of the plurality of light-emitting diodes 230 when the elongate light bar 225 is mounted to, for example, the inlet door or outlet door of the electronics rack, and the door is pivoted open. This pivotal adjustment, combined with placement of the elongate light bar adjacent to the proximal edge of the inlet or outlet door provides a wide distribution area of light across the inside of the electronics rack.

Figure 4A:
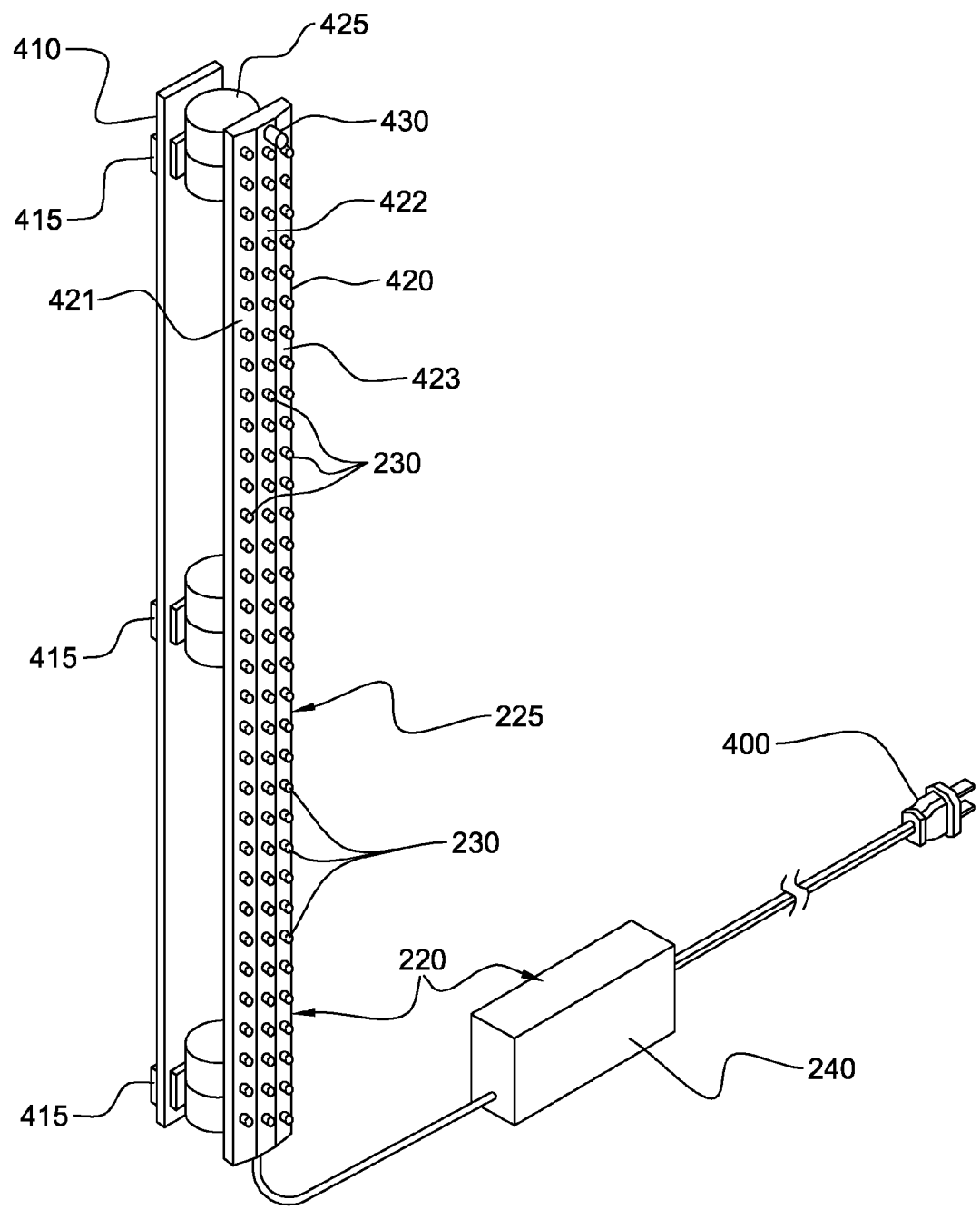
FIG. 4A is a perspective view of a detailed embodiment of the light source of FIGS. 2 & 3, in accordance with an aspect of the present invention.
Figure 4B:
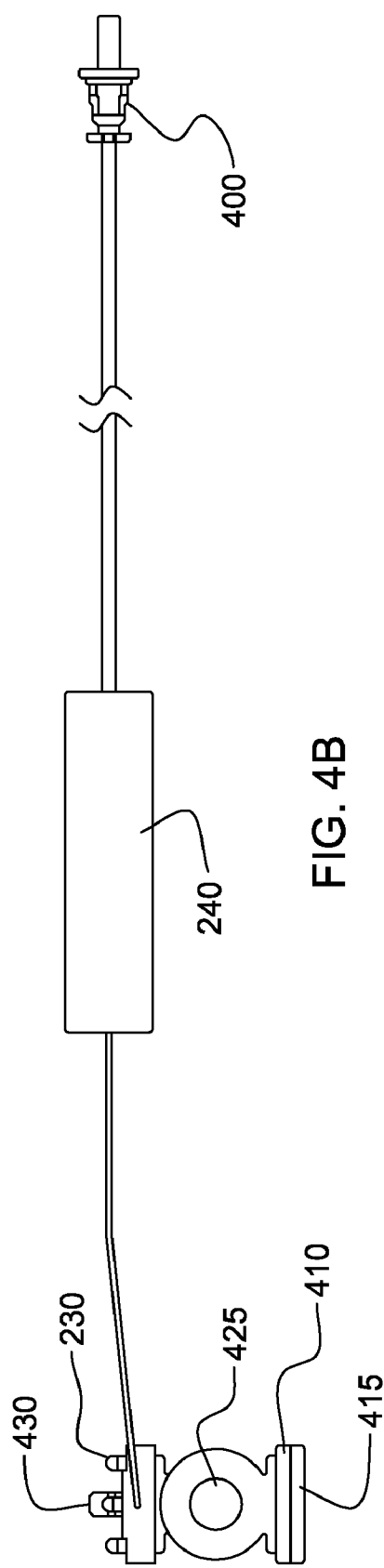
FIG. 4B is a top plan view of the light source of FIG. 4A, in accordance with an aspect of the present invention.
Figure 4C:
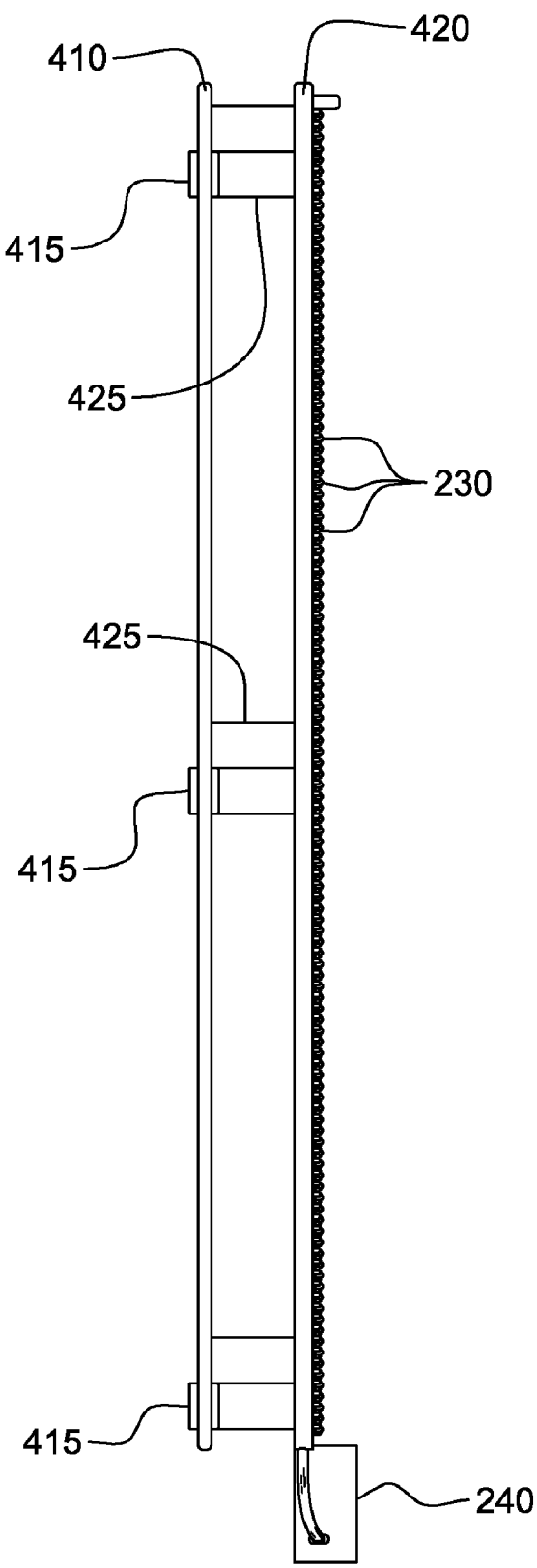
FIG. 4C is a side elevational view of the light source of FIGS. 4A & 4B, in accordance with an aspect of the present invention.
Figure 4D:
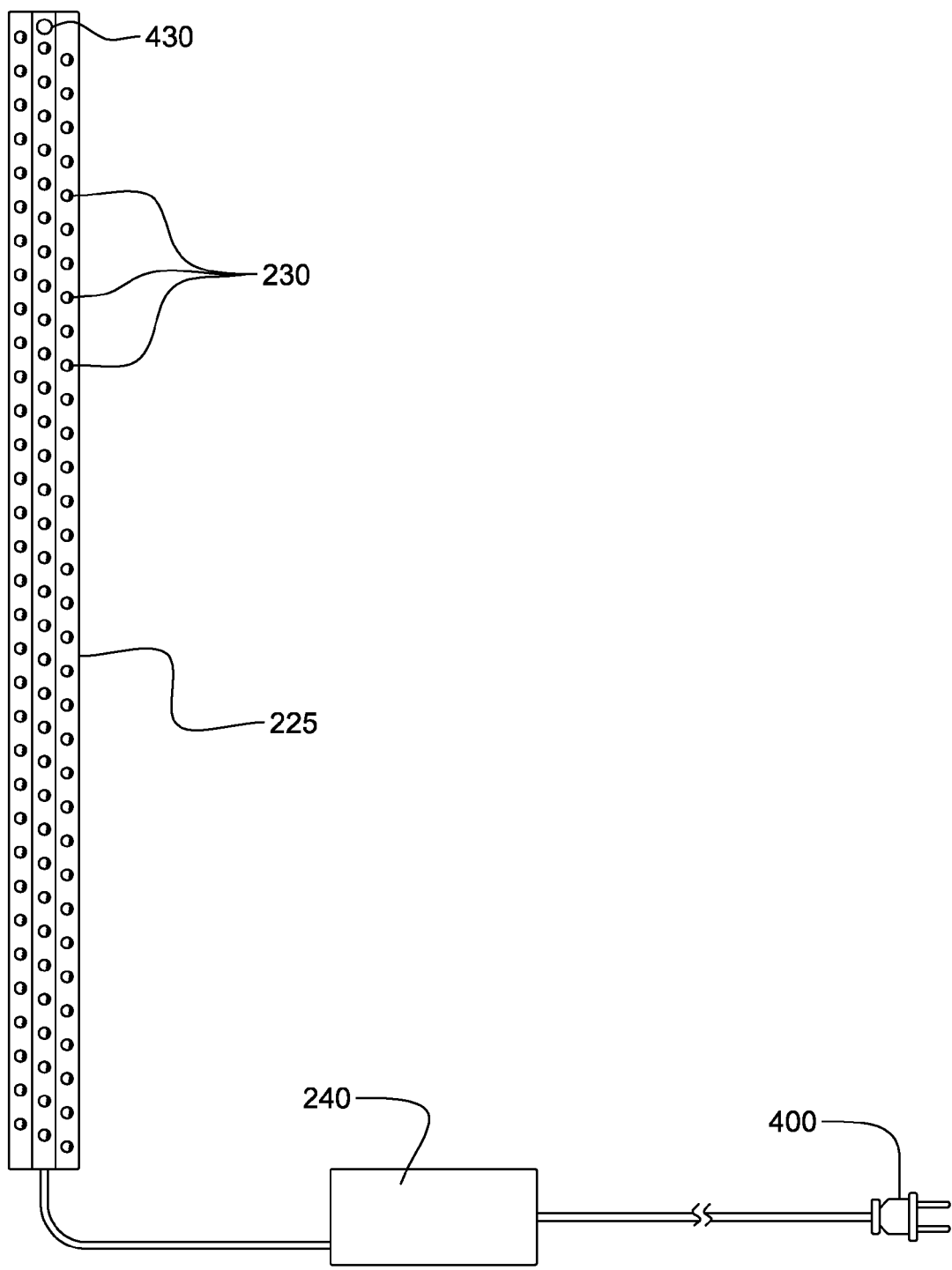
FIG. 4D is a front elevational view of the light source of FIGS. 4A-4C, in accordance with an aspect of the present invention.

Wide distribution of light is further achieved by arraying the light-emitting diodes 230 in multiple columns, as illustrated in FIGS. 4A & 4D. Further, the elongate, light-emitting diode housing structure 420 is shown to comprise a left side column surface 421, a center column surface 422, and a right side column surface 423, with left side column surface 421 and right side column surface 423 being angled relative to center column surface 422, wherein the surface from which the plurality of light-emitting diodes project is at least partially (roughly) curved. In one embodiment, the left side column surface 421 and right side column surface 423 project at 10° angles from center column surface 422. Further, distributed illumination is facilitated by employing an alternating array of high intensity light-emitting diodes of different beam pattern angles. For example, LEDs with 15° and 30° beam pattern angles are available from Avago Technologies, and may be employed in an alternating fashion. As illustrated in the figures, an ON/OFF switch 430 is also provided for controlling activation of the light-emitting diodes.

Figure 5:
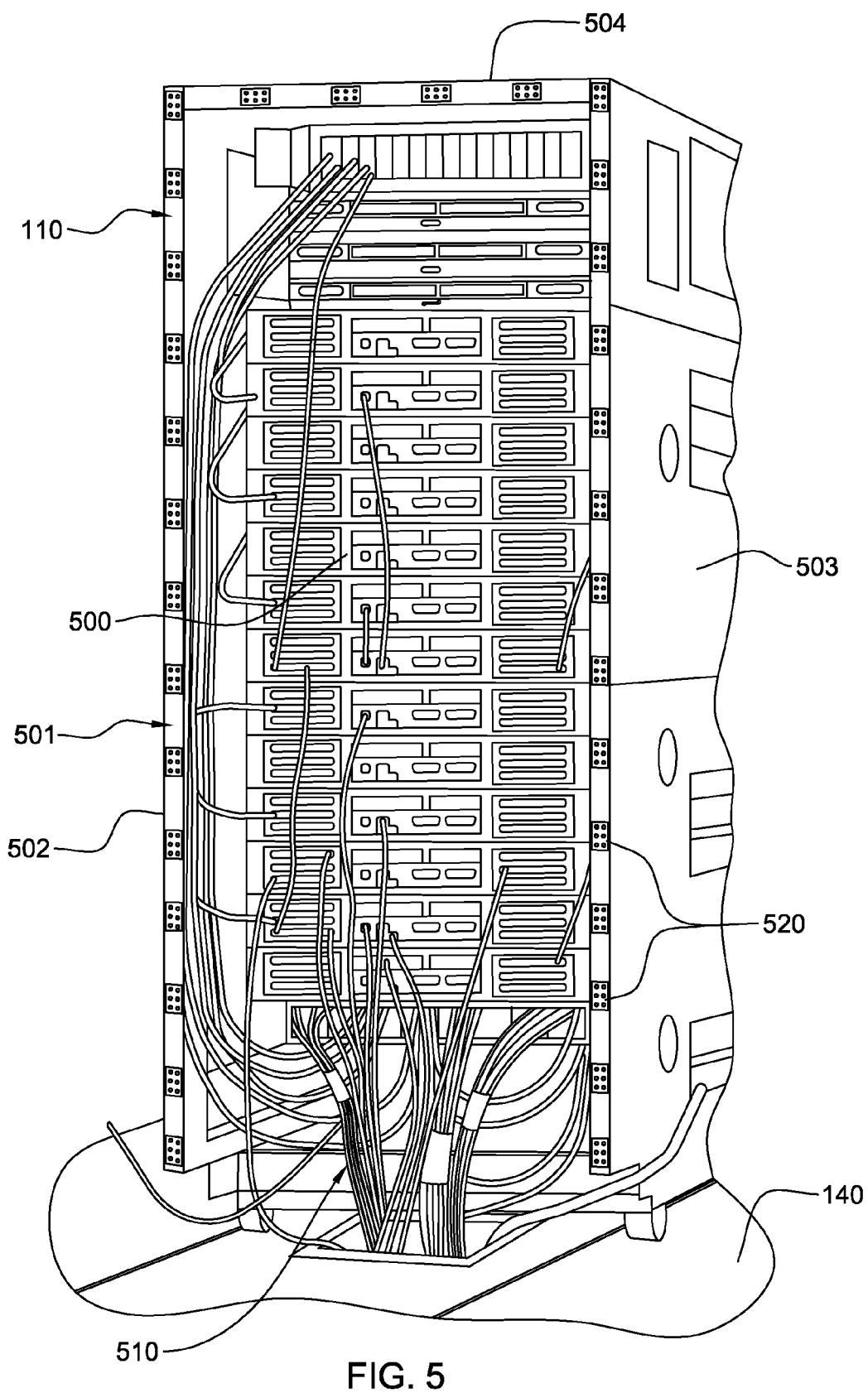
FIG. 5 is a perspective view of an alternate embodiment of an electronics rack and light source, in accordance with an aspect of the present invention.

FIG. 5 depicts an alternate embodiment of an electronics system, in accordance with an aspect of the present invention. In the illustrated embodiment, an air outlet side of an electronics rack 110 is illustrated, with the outlet door thereof removed. Electronics rack 110 includes a rack frame 501 which supports a plurality of electronics subsystems 500 from which a plurality of cables 510 extend, at least some of which pass through an opening in raised floor 140 for coupling, for example, to one or more other electronics racks or electronics equipment within a data center.

Rack frame 501 includes a first side 502 and a second side 503 disposed in opposing relation, and a top 504. First and second sides 502 and 503 extend (in one embodiment) from the depicted air outlet side of electronics rack 110 to an air inlet side thereof. In accordance with an aspect of the present invention, multiple light-emitting diode structures 520 are arrayed along first and second sides 502, 503 and top 504 of rack frame 501. Each light-emitting diode structure 520 may comprise one or multiple light-emitting diodes for facilitating illumination of the air outlet side (or air inlet side) of electronics rack 110. In the illustrated embodiment, light-emitting diode structures 520 are disposed on exposed edges of first and second sides 502, 503 and top 504, with the light-emitting diodes thereof projecting away from electronics rack 110. In an alternate configuration, the light-emitting diode structures 520 could be disposed on inner surfaces of first and second sides 502, 503 and top 504 so as to project inwardly within electronics rack 110. Also, in the illustrated embodiment, light-emitting diode structures 520 are arrayed in a uniform pattern around first and second sides 502, 503 and top 504 to facilitate a uniform distribution of light around, for example, the air outlet side (or air inlet side) of the electronics rack. This is depicted by way of example only. In an alternate embodiment, the light-emitting diode structures could be secured to rack frame 501 in non-uniform spacing, for example, at only a lower portion or only an upper portion of the electronics rack, as desired for a particular implementation.

Figure 7B:
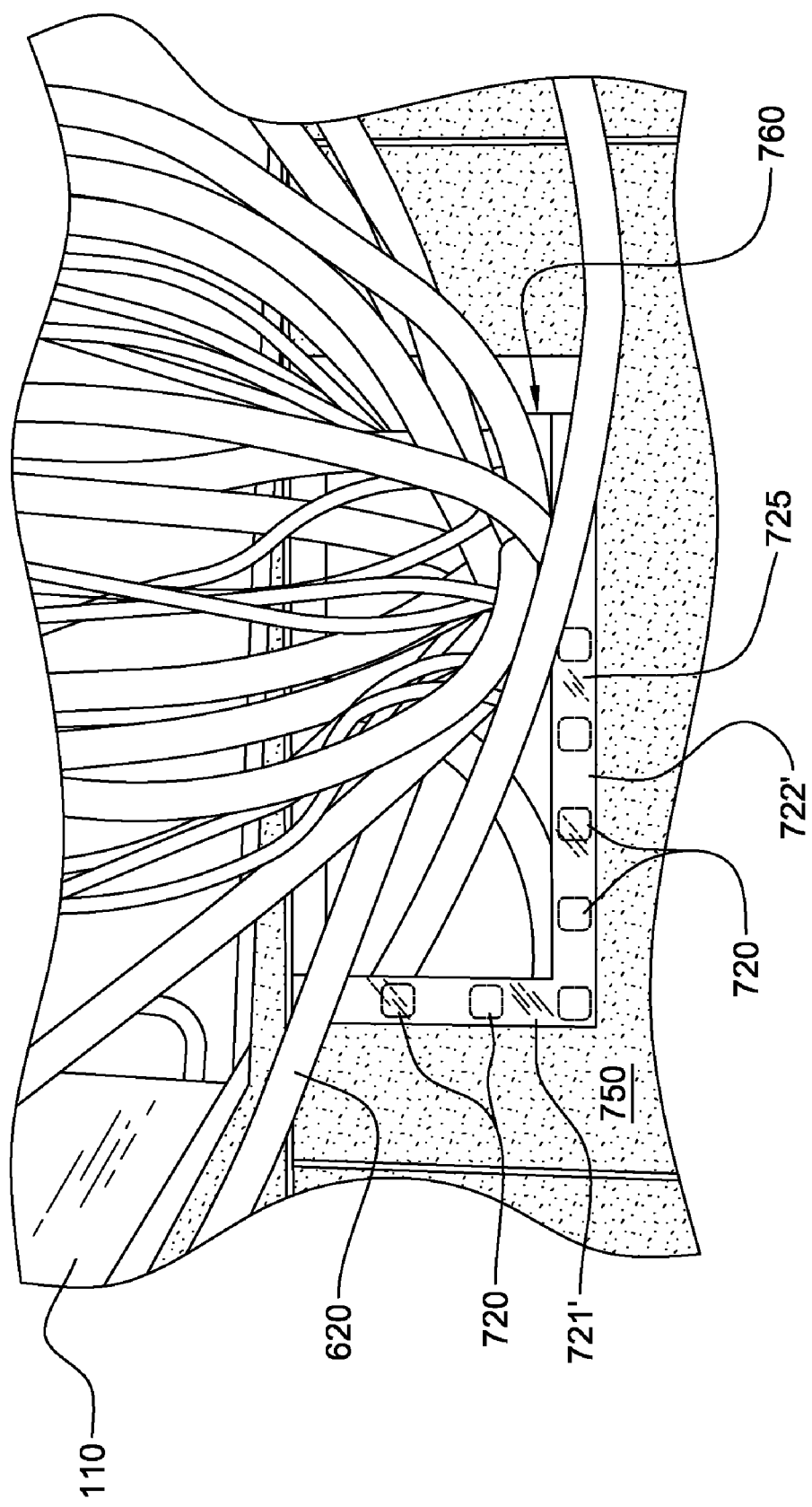
FIG. 7B illustrates a floor tile with a middle cable cutout, and a light source shown disposed within the floor tile along multiple edges of the middle cable cutout, in accordance with an aspect of the present invention.

FIGS. 6-7B illustrate an alternate implementation of a light source, in accordance with an aspect of the present invention. Beginning with FIG. 6, a partial plan view is shown of a conventional floor tile 600 with a corner cutout 610 for facilitating passage of cables 620 through floor tile 600 into space under the floor, for example, to facilitate coupling of cables 620 from an electronics rack to one or more adjacent electronics racks or other electronics equipment within a data center. Floor tile 600 is assumed to be disposed adjacent to or underneath the electronics rack from which cables 620 extend.

FIG. 7A depicts in part an embodiment of a light source comprising a plurality of light-emitting diode structures 720, in accordance with an aspect of the present invention. In this embodiment, light-emitting diode structures 720 are disposed within floor tile 700 along or adjacent to the edges thereof defining corner cutout 710 through which cables 620 from an associated electronics rack (not shown) pass. Floor tile 700 is assumed to be disposed adjacent to, for example, the air inlet side or air outlet side of an electronics rack, or fully or partially disposed under the electronics rack, for example, to align with opening 200 (FIG. 2) at the air inlet side of the electronics rack or opening 300 (FIG. 3) at the air outlet side of the electronics rack. As shown, light-emitting diode structures 720 are arrayed along a first edge 721 and a second edge 722 in floor tile 700 defining corner cutout 710. In one embodiment, each light-emitting diode structure 720 comprises one or multiple light-emitting diodes which are powered, for example, by an appropriate 3-4V, 10-20 mA power supply (not shown) disposed beneath the illustrated raised floor. A light transparent material 725 is provided over light-emitting diode structures 720 to protect the diodes. Advantageously, by providing light-emitting diode structures 720 within the floor tile disposed adjacent to the air inlet side or air outlet side of the electronics rack, illumination of a lower portion of the air inlet or air outlet side of the electronics rack is achieved.

FIG. 7B depicts a similar light source implementation to that of FIG. 7A. In FIG. 7B, a floor tile 750 is provided with a middle cable cutout 760, through which cables 620 from an associated electronics rack 110 pass, for example, at either the air inlet side or air outlet side of electronics rack 110. The light source includes a plurality of light-emitting diode structures 720, each of which comprises one or more light-emitting diodes, such as the diodes referenced above. The light-emitting diode structures 720 are powered by an appropriate 3-4V power supply (not shown) disposed beneath the floor comprising tile 750. As illustrated, light-emitting diode structures 720 are arrayed along a first edge 721' and a second edge 722' of floor tile 750 defining middle cable cutout 760. Those skilled in the art will note that the light-emitting diode structures 720 could also be disposed along one or more other edges of the floor tile defining the corner or middle cable cutouts. A light transparent material 725 covers the light-emitting diode structures 720 to protect the diodes from damage. Advantageously, light-emitting diode structures 720 provide illumination to a lower portion of electronics rack 110 in an area of high density cabling, and therefore facilitate servicing of the electronics rack, for example, at a lower portion thereof.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An electronics system comprising:
an electronics rack, the electronics rack comprising:
a rack frame;
at least one electronics subsystem disposed within the electronics rack and supported by the rack frame;
a door hingedly mounted along one edge to the rack frame of the electronics rack at one side thereof; and
an apparatus for facilitating servicing of the electronics rack, the apparatus comprising a light source mounted to an inside of the door of the electronics rack, the light source comprising:
a plurality of light-emitting diodes, the plurality of light-emitting diodes being sized to illuminate at least a portion of the electronics rack at the one side thereof to facilitate servicing of at least the portion of the one side of the electronics rack, wherein the light-emitting diodes comprise multiple diodes of different beam patterns of light emitting therefrom, and wherein the diodes of different beam patterns of light are arrayed in an alternating arrangement of different beam patterns of light;
an elongate light bar, the elongate light bar comprising a base plate and an elongate, light-emitting diode support structure pivotally connected to the base plate, wherein the plurality of light-emitting diodes are disposed along the elongate, light-emitting diode support structure, and the base plate is mounted to the inside of the door, and wherein the elongate, light-emitting diode support structure pivots relative to the base plate to allow pivoting of the light-emitting diode support structure towards the one side of the electronics rack with pivoting of the door away therefrom, to facilitate illumination of the portion of the electronics rack with opening of the door in any of a plurality of angles relative to the electronics rack;
a power supply for supplying power to the plurality of light-emitting diodes; and
wherein the door is hingedly mounted along a proximal edge to the rack frame and wherein the elongate light bar is mounted to the inside of the door adjacent to the proximal edge thereof to facilitate illumination of the one side of the electronics rack with pivoting open of the door in any of the plurality of angles relative to the electronics rack.

2. The electronics system of claim 1, wherein the electronics rack comprises an air inlet door and an air outlet door, the air inlet door being hingedly mounted along a proximal edge to the rack frame at an air inlet side of the electronics rack, and the air outlet door being hingedly mounted along a proximal edge to the rack frame at and air outlet side of the electronics rack, the door being one of the air inlet door or the air outlet door.

3. The electronics system of claim 2, wherein the elongate light bar is mounted vertically to the inside of the door along the proximal edge thereof.

4. The electronics system of claim 3, wherein the elongate light bar is mounted to the door via a temporary attachment mechanism coupled to the elongate light bar.

5. The electronics system of claim 2, wherein the base plate is mounted to the inside of the door within a recessed region of the door adjacent to the proximal edge thereof, and wherein the light source does not project past an edge of the door contacting the electronics frame when the door is in closed position.

6. The electronics system of claim 1, wherein the light-emitting diode support structure comprises an at least partially angled surface from which the plurality of light-emitting diodes extend in multiple columns, the plurality of light-emitting diodes comprising a first plurality of diodes of a first beam pattern and a second plurality of diodes of a second beam pattern, and wherein diodes of the first beam pattern and diodes of the second beam pattern alternate in each column of the array.

7. The electronics system of claim 6, wherein the diodes of the first beam pattern emit a 2× wider beam pattern than diodes of the second beam pattern.

8. The electronics system of claim 7, wherein the at least partially angled surface comprises three surface sections, each extending at an angle to at least one other surface section of the three surface sections, and wherein the multiple columns comprise three columns, each column being associated with a different surface section of the three surface sections of the light-emitting diode support structure.

* * * * *